(12) United States Patent
Shen et al.

(10) Patent No.: US 10,811,422 B2
(45) Date of Patent: Oct. 20, 2020

(54) SEMICONDUCTOR RECESS TO EPITAXIAL REGIONS AND RELATED INTEGRATED CIRCUIT STRUCTURE

(71) Applicant: GLOBALFOUNDRIES INC., Grand Cayman (KY)

(72) Inventors: Yanping Shen, Saratoga Springs, NY (US); Wei Hong, Clifton Park, NY (US); Hui Zang, Guilderland, NY (US); David P. Brunco, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 46 days.

(21) Appl. No.: 16/196,060

(22) Filed: Nov. 20, 2018

(65) Prior Publication Data

US 2020/0161315 A1    May 21, 2020

(51) Int. Cl.
*H01L 27/11*    (2006.01)
*H01L 29/78*    (2006.01)
*H01L 29/08*    (2006.01)

(52) U.S. Cl.
CPC ...... *H01L 27/1116* (2013.01); *H01L 27/1104* (2013.01); *H01L 29/0847* (2013.01); *H01L 29/785* (2013.01); *H01L 29/7848* (2013.01)

(58) Field of Classification Search
CPC ............. H01L 27/1116; H01L 27/1104; H01L 29/0847; H01L 29/7848; H01L 29/785
See application file for complete search history.

(56) References Cited

U.S. PATENT DOCUMENTS

| | | | |
|---|---|---|---|
| 8,586,455 B1 | 11/2013 | Chang et al. | |
| 9,748,245 B1 | 8/2017 | Cheng et al. | |
| 10,163,635 B1 | 12/2018 | Qi et al. | |
| 2005/0112817 A1* | 5/2005 | Cheng | H01L 21/823807 438/219 |
| 2009/0291540 A1* | 11/2009 | Zhang | H01L 21/26506 438/229 |
| 2010/0167505 A1* | 7/2010 | Chew | H01L 21/02532 438/503 |
| 2010/0219475 A1* | 9/2010 | Kronholz | H01L 21/823807 257/351 |
| 2015/0364490 A1* | 12/2015 | Oda | H01L 21/26513 257/351 |
| 2019/0035908 A1* | 1/2019 | Liao | H01L 21/823814 |
| 2019/0206744 A1* | 7/2019 | Maruyama | H01L 21/84 |

* cited by examiner

*Primary Examiner* — Fernando L Toledo
*Assistant Examiner* — Neil R Prasad
(74) *Attorney, Agent, or Firm* — Francois Pagette; Hoffman Warnick LLC (57) ABSTRACT

Methods according to the disclosure include forming a mask over a substrate to cover a first semiconductor region on the substrate and a first gate structure on the first semiconductor region. The second semiconductor region may be recessed from an initial height above the substrate to a reduced height above the substrate. The mask may be removed before forming a plurality of cavities by etching the first and second semiconductor regions, the plurality of cavities including a first cavity having a first depth within the first semiconductor region and a second cavity having a second depth within the second semiconductor region, wherein the second depth is greater than the first depth. The method also may include forming a plurality of epitaxial regions within the plurality of cavities.

19 Claims, 10 Drawing Sheets

SEMICONDUCTOR RECESS TO EPITAXIAL REGIONS AND RELATED INTEGRATED CIRCUIT STRUCTURE

BACKGROUND

Technical Field

The present application relates to methods of forming an integrated circuit (IC) structure, and structures associated with the disclosed methods. More particularly, the present application relates to forming types of IC components, e.g., transistors, by recessing one semiconductor region to form epitaxial regions of different size.

Design systems are commonly used to create integrated circuits (ICs) and, in particular, to design front end of line (FEOL) components, e.g., transistors for providing active electrical functions of a device. As advances occur, smaller widths for wires and vias are provided. Additional design constraints imposed by smaller wire and via widths, e.g., requirements for uni-directional wiring at any metal layer, may create manufacturing challenges. The intended circuit structure must comply with several design rules before manufacture. Design rule spacing constraints can limit a variety of attributes, e.g., the maximum separation distance between adjacent gates in a cell array. Such constraints can affect the ability to form functional elements which connect gates and/or other structures together, e.g., two or more vias connecting to nearby positions of a single device layer, as well as the materials which may be used to form conductive components of a transistor. Complying with design rules for transistor elements may be especially challenging when adjacent transistors serve different functions during operation. For example, transistors used in a memory may require source/drain regions of a smaller size than transistors for providing logic for a device.

Forming different transistor types close together on a device structure may also pose a risk of unintentional source/drain epitaxial merger. Source/drain epitaxial merger is when two epitaxially-grown regions of semiconductor material, from two different devices, grow to contact each other and thus form a single continuous epitaxial region. Source/drain epitaxial merger, in some cases, may cause electrical shorting between two different device structures such as memory and logic. In extreme cases, electrical shorts from source/drain epitaxial merger may interfere with logic operations of a device, or other functions such as storage and retrieval of data. Limiting the growth size and growth time of epitaxial regions may prevent source/drain epitaxial merger, but also may prevent larger source/drain regions from being formed in transistors which benefit from source/drain regions of larger size.

SUMMARY

A first aspect of the present disclosure provides a method of forming an integrated circuit (IC) structure, the method including: forming a mask over a substrate to cover a first semiconductor region on the substrate and a first gate structure on the first semiconductor region, without covering a second semiconductor region on the substrate and a second gate structure on the second semiconductor region, the first semiconductor region horizontally separated from the second semiconductor region; recessing the second semiconductor region from an initial height above the substrate to a reduced height above the substrate; removing the mask; forming a plurality of cavities by etching the first and second semiconductor regions after removing the mask, the plurality of cavities including a first cavity having a first depth within the first semiconductor region and a second cavity having a second depth within the second semiconductor region, the second depth being greater than the first depth; and forming a plurality of epitaxial regions within the plurality of cavities, the plurality of epitaxial regions including a first source/drain region within the first semiconductor region adjacent the first gate structure, and a second source/drain region within the second semiconductor region adjacent the second gate structure.

A second aspect of the present disclosure provides a method of forming an integrated circuit (IC) structure, the method including: forming a mask over a substrate to cover a first semiconductor fin on the substrate and a first gate structure on the first semiconductor fin, without covering a second semiconductor fin on the substrate and a second gate structure on the second semiconductor fin, the first semiconductor fin horizontally separated from the second semiconductor fin by a shallow trench isolation (STI); recessing the second semiconductor fin from an initial height above the substrate to a reduced height above the substrate; removing the mask; forming a plurality of cavities by etching the first and second semiconductor fins after removing the mask, the plurality of cavities including a first cavity having a first depth within the first semiconductor fin and a second cavity having a second depth within the second semiconductor fin; and forming a plurality of epitaxial regions on the first and second semiconductor fins within the plurality of cavities, the plurality of epitaxial regions includes a first source/drain region on the first semiconductor fin, and a second source/drain region on the second semiconductor fin; forming a static random access memory (SRAM) transistor on the first semiconductor fin; and forming a logic transistor on the second semiconductor fin, the logic transistor being electrically isolated from the SRAM transistor.

A third aspect of the present disclosure provides an integrated circuit (IC) structure, including: a first semiconductor region over a substrate; a first transistor on the first semiconductor region, the first transistor including a first source region and a first drain region each having a first depth within the first semiconductor region and a first horizontal width; a second semiconductor region over the substrate, with a shallow trench isolation (STI) horizontally separating the second semiconductor region from the first semiconductor region; and a second transistor on the second semiconductor region, the second transistor including a second source region and a second drain region each having a second depth within the second semiconductor region and a second horizontal width, the second depth being greater than the first depth, and the second horizontal width being greater than the first horizontal width.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Figure 1:
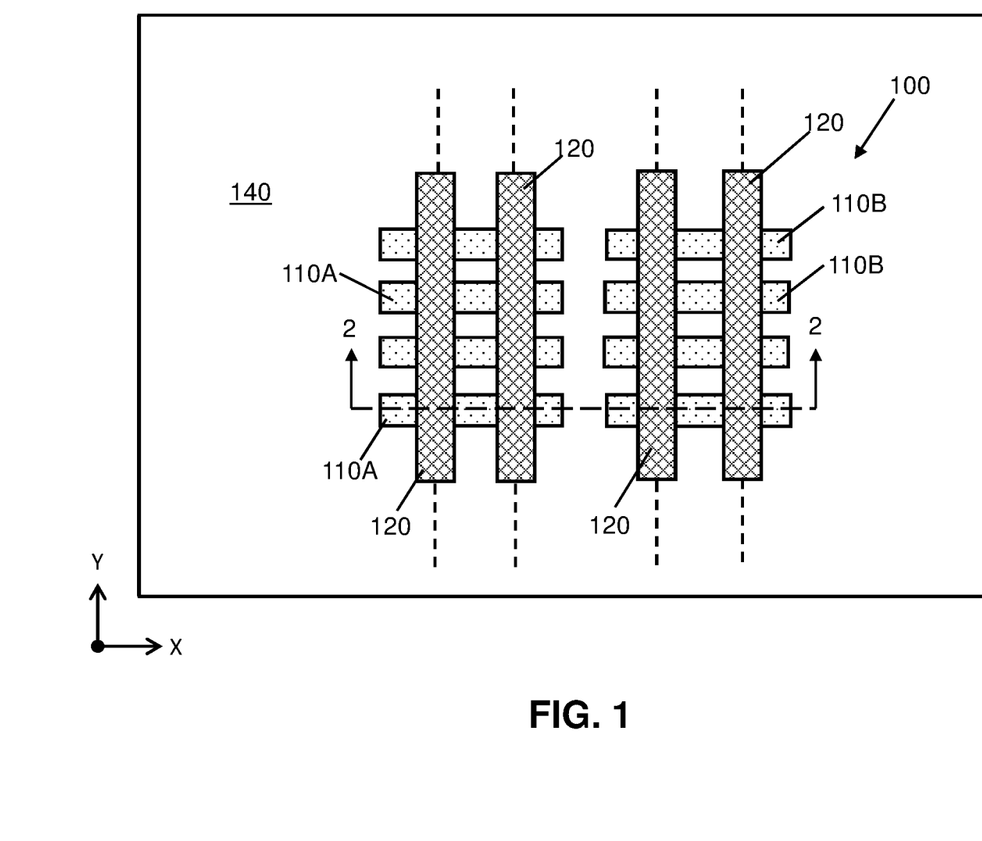
FIG. 1 shows a plan view of an initial structure to be processed according to embodiments of the disclosure.

FIG. 1 provides a plan view of a structure 100 to be processed according to embodiments of the disclosure. The example structure 100 of FIG. 1 provides one preliminary set of materials targeted for use with embodiments of the disclosure, but it is understood that embodiments of the disclosure may be implemented on different designs without significant changes to the various example techniques discussed herein. Structure 100 can include a set (i.e., one or more) of semiconductor regions from which multiple transistor structures may be formed. Semiconductor regions can be formed in a variety of ways from an initial substrate. Various embodiments may include regions of semiconductor material in the form of semiconductor fins (simply "fins" hereafter) 110A, 110B extending in parallel with each other. Throughout the disclosure, fins 110A, 110B may be referred to collectively simply as fins 110. FIG. 1 provides an example including four fins 110, but structure 100 may include any desired number of fins 110. Structure 100 may also include a set (i.e., one or more) gate structures 120 each extending transversely over fins 110. Although fin(s) 110 are provided as an illustrated example, embodiments of the disclosure may be formed on any type of semiconductor region (e.g., bulk semiconductor material) without significant modifications. A shallow trench isolation (STI) 140 of structure 100, may be positioned underneath and/or adjacent to fin(s) 110 and gate structure(s) 120. STI(s) 140 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (Si-COH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Figure 2:
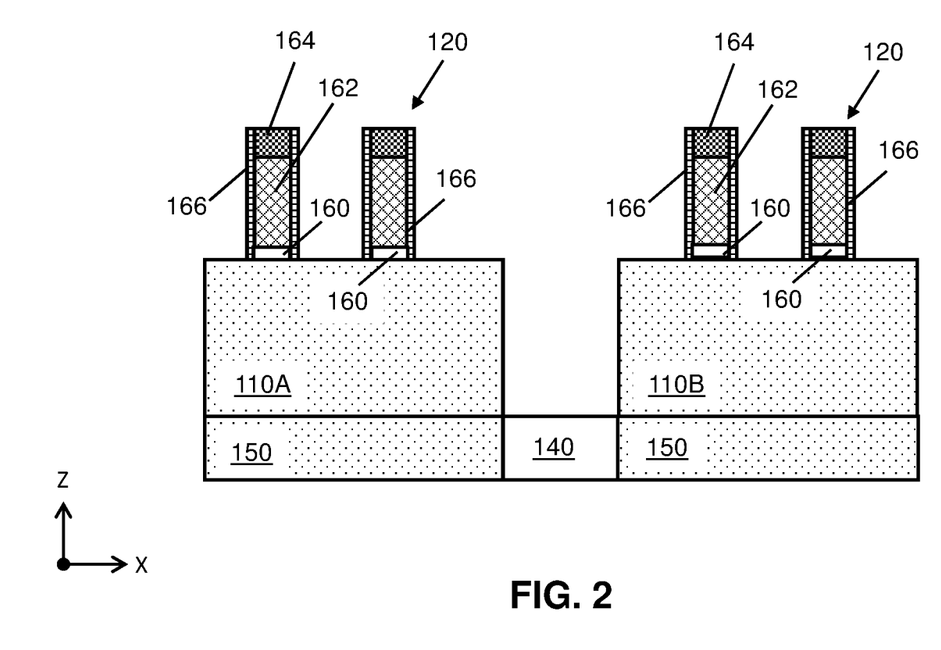
FIG. 2 shows a first cross-sectional view, along line 2-2 of FIG. 1, of the initial structure according to embodiments of the disclosure.

Referring to FIG. 2, fins 110 and gate structures 120 of structure 100 are shown in further detail. Each fin 110 may be formed from an underlying semiconductor substrate 150, e.g., by removing targeted portions of substrate 150 to a predetermined depth, causing the non-removed portions to form fins 110 directly on substrate 150. Substrate 150 may include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In the accompanying FIGS. 1-12, one fin 110 is separately identified as first fin 110A, and another fin 110 is separately identified as second fin 110B. First and second fins 110A, 110B initially may be identical to each other. First and second fin(s) 110A, 110B may appear in locations different from those in the accompanying FIGS., e.g., portions of substrate 150 which are not in a single plane or substantially horizontally aligned. In still further examples, fins 11A, 110B may be initially formed as a single fin and subsequently separated into two or more distinct fins by forming a single diffusion break (SDB) to subdivide one fin into multiple fins. In any case, subsequent operations discussed herein cause fins 110A, 110B to be distinct from each other.

Each gate structure 120 may lack one or more functional components used in a complete IC structure, and may include one or more dummy gates to be processed at a different stage of forming a product. Such components may be eventually replaced with functional elements in other process steps, e.g., by using a replacement metal gate (RMG) processing paradigm. Gate structures 120 thus may cover one or more semiconductor fins 110 positioned above substrate 150, e.g., by coating exposed sidewalls and an upper surface of fin(s) 110. Gate structures 120 may include multiple subcomponents. Each gate structure 120 may include a gate dielectric film 160. Gate structure 120 may include a gate region 162 formed on gate dielectric 160. Gate region 162 may include one or more precursor semiconductor materials formed on gate dielectric film 160, e.g., to allow other portions of a structure to be formed before gate structure 120 is replaced with functional conductive components. In other cases, gate region 162 may include one or more conductive components for providing a gate terminal of a transistor, e.g., in a "gate first" processing paradigm.

Embodiments of the disclosure may be implemented without regard to whether gate region 162 is formed of a precursor material (e.g., semiconductor) or an active material (e.g., metal). Gate structures 120 also may include a gate cap 164 over gate region 162. Gate cap 164 may include one or more insulative materials configured to protect underling portions of gate region 162 from being removed, modified, implanted, etc., as other portions of a structure are formed. For instance, gate cap 164 may include silicon nitride (SiN) and/or other insulative materials noted herein. Gate structure 120 may also include spacers 166 formed adjacent to gate dielectric film 160 and gate region 162. Spacer(s) 166 may be provided as one or more bodies of insulating material formed on exposed portions of STI(s) 140 and/or gate structure(s) 120, e.g., by deposition/etching, thermal growth, etc. First spacer(s) 166 may be formed on or adjacent to gate structure(s) 120 to electrically and physically separate gate structure(s) 120 from other components of structure 100. Spacer(s) 166 may include one or more low-K dielectric materials, i.e., dielectric materials with a dielectric constant of at most approximately 3.9. Spacer 166, for example, may include one or more insulative oxide and/or nitride materials. In some cases, spacer(s) 166 may include one or more insulative materials included in STI(s) 140 or a different insulative material. As noted elsewhere herein, spacer(s) 166 may be a preliminary spacer material selected for ease of removal and replacement in subsequent processing.

Figure 3:
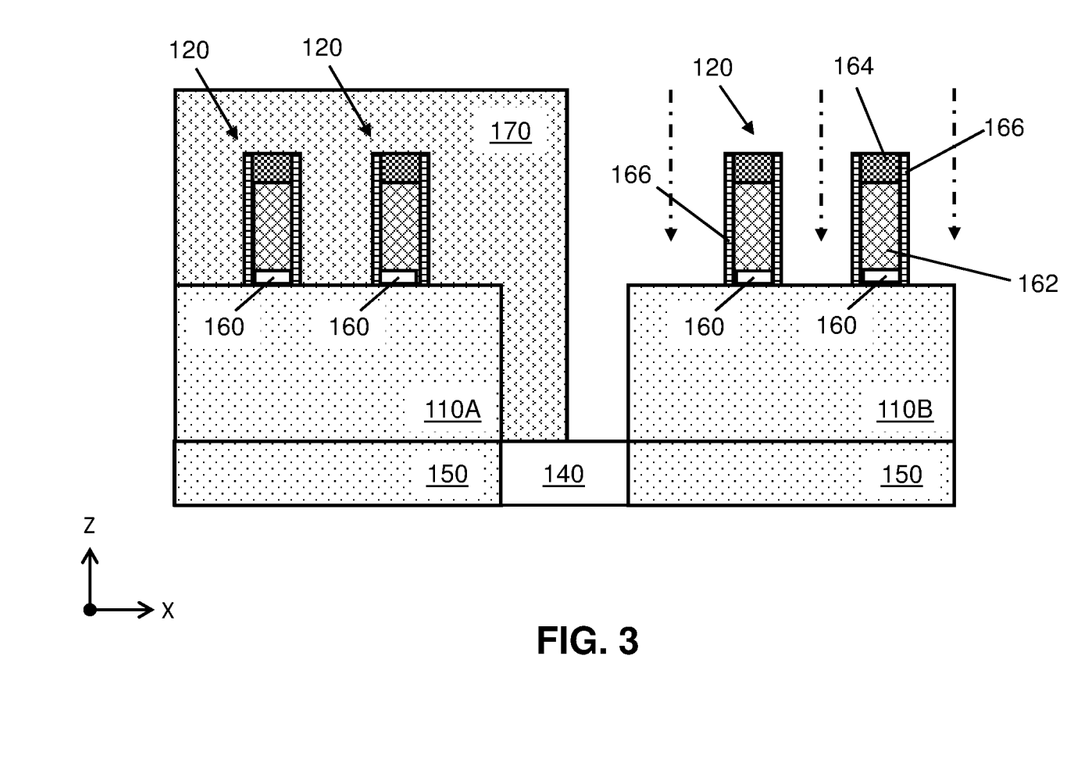
FIG. 3 shows a cross-sectional view of forming a mask over a first semiconductor region and implanting ions into a second semiconductor region according to embodiments of the disclosure.

Proceeding to FIG. 3, one or more masks 170 may be deposited to cover one or more corresponding first fins 110A. Mask(s) 170 may include openings or otherwise may be structured not to cover one or more second fins 110B. Second fins 110B not covered by mask(s) 170 remain susceptible to processing when mask(s) 170 remains in place over first fin(s) 110A. As discussed herein, mask(s) 170 may protect first fin(s) 110A from being recessed, implanted, etc., so that transistors may be formed with differently-sized source/drain regions. Mask(s) 170 may initially be a liquid deposited on first fin 110A, gate structure(s) 120, and/or portions of STI 140 as a thin film, then solidified by low temperature anneal. Locations not covered by mask(s) 170 may be susceptible to processing, e.g., by various etchants as discussed herein, while other materials beneath mask(s) 170 will be protected. Mask(s) 170 may not be formed over second fin(s) 110B, causing one or more gate structure(s) 120, and/or portions of STI 140, to be susceptible to etching.

Mask(s) 170 in some cases may take the form of one or more insulative materials, and in other cases may wholly or partially include a planarization material such as an organic planarization layer (OPL). A "planarization layer" generally refers to any material formed on a surface to produce a planar surface, and can be formed by, e.g., the deposition of material followed by polishing, deposition followed by the forming of a flowable oxide material thereon, deposition alone, and/or any other currently known or later developed process or combination of processes. In this case, mask(s) 170 may include one or more carbon films removable by wet and/or dry etching processes. Mask(s) 170 may be formed by blanket depositing of OPL material over each exposed structural element, and then etching the OPL material back to a desired height over fin(s) 110A, STI(s) 140, substrate 150, etc.

With mask(s) 170 in place, further processing according to the disclosure may include implanting one or more dopants into second fin(s) 110B. The presence of mask(s) 170 will prevent ion implantation into first fin(s) 110A. The implanting of ions into second fin(s) 110B, where applicable, may structurally differentiate fin(s) 110A, 110B during subsequent processing and/or device operation. The implanting of second fin(s) 110B may include, for example, halo doping. Halo doping is a process by which a high concentration of additional dopants are implanted into previously-doped semiconductor region (e.g., second fin 110B) at a thin depth relative to the size of the region being doped, e.g., at most approximately three percent of the total vertical depth of the region. Halo doping, as known in the art, may limit the size of depletion regions near the area being doped. In other cases, selected portions of second fin(s) 110B may be implanted with a strain-inducing material, such as germanium or carbon, formed on fins composed of silicon. Other implantation processes may be performed subsequently to dope second fin(s) 110B and various other semiconductor materials in further embodiments.

Figure 4:
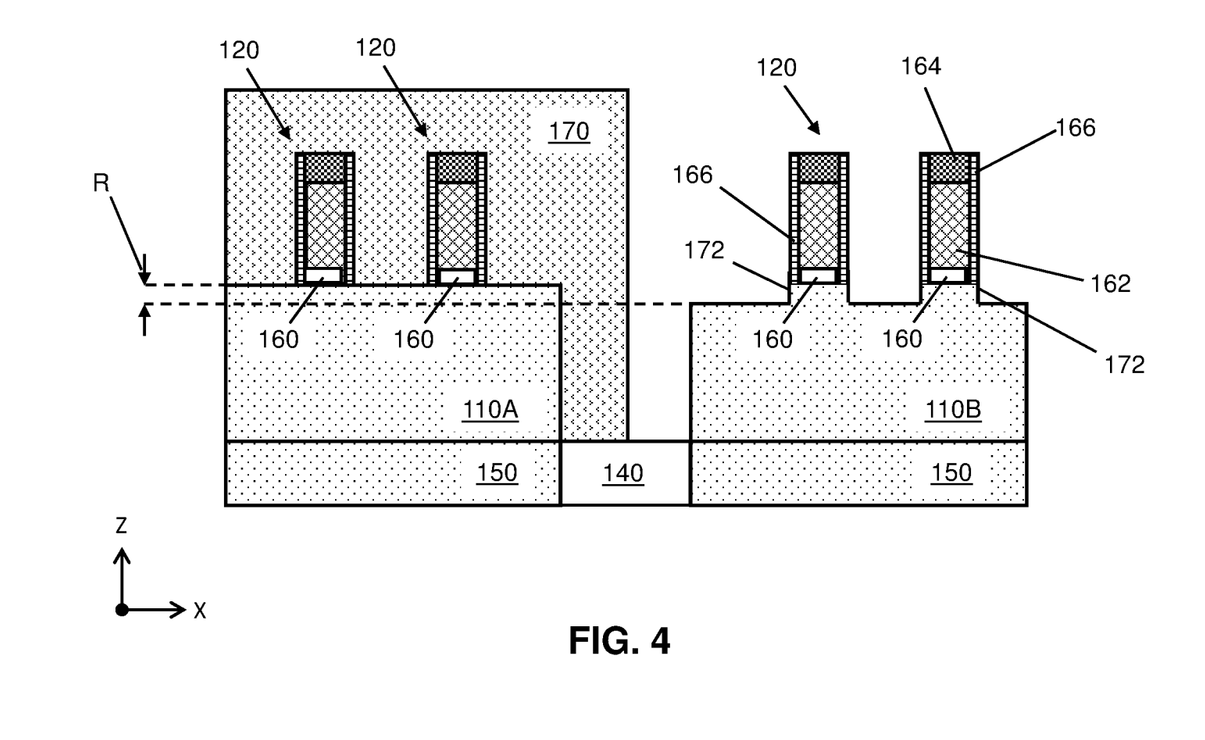
FIG. 4 shows a cross-sectional view of recessing the second semiconductor region according to embodiments of the disclosure.

Proceeding to FIG. 4, various embodiments of the disclosure may include etching second fin(s) 110B, causing second fin(s) 110B to be recessed relative to first fin(s) 110A. The etching may be performed with mask(s) 170 in place, causing first fin(s) 110A to be unaffected during the etching. Portions of second fin(s) 110A not covered by mask(s) 170 or gate structure(s) 120 may be etched, e.g., using a downward directional etch. Second fin(s) 110B also may be etched using an etchant selective to semiconductor materials. Etching generally refers to the removal of material from a substrate (or structures formed on the substrate), and is often performed with a mask in place so that material may selectively be removed from certain areas of the substrate, while leaving the material unaffected in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while, leaving another material (such as polysilicon or nitride) relatively intact. This ability to selectively etch given materials is fundamental to many semiconductor fabrication processes. A wet etch will generally etch a homogeneous material (e.g., nitride) isotopically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases which approach the wafer approximately from one direction, and therefore this process is highly anisotopic. Reactive-ion etching (RIE) operates under conditions intermediate between sputter and plasma etching and may be used to produce deep, narrow features, such as STI trenches. As fin 110B is etched, gate structure 120 may protect portions of the fin material thereunder from being etched. Other portions of fin 110B not covered by gate structure 120 may be recessed to a height above substrate 150 that is less than the height of portion(s) of first fin(s) 110A not covered by gate structure(s) 120. The resulting difference in height is illustrated via a recess depth R of second fin(s) 110B relative to first fin(s) 110A. According to an example, recess depth R may be at most approximately ten nanometers (nm), but the size of recessed depth R may be different in other embodiments.

Figure 5:
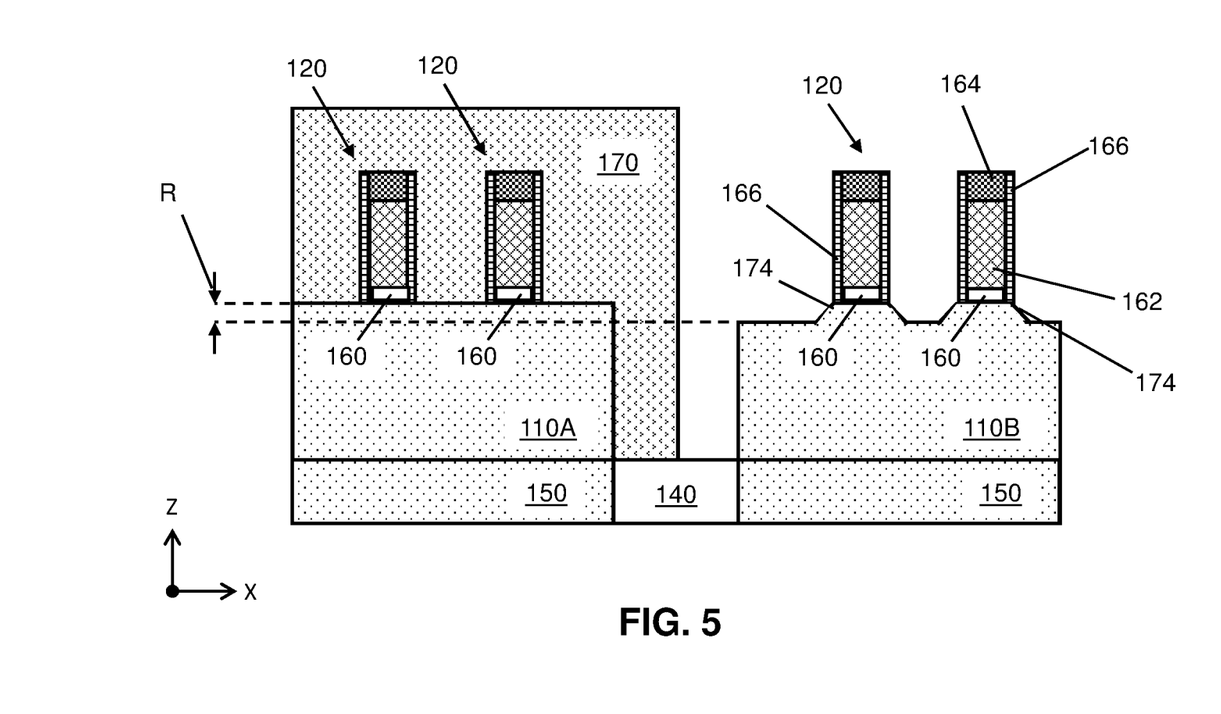
FIG. 5 shows a cross-sectional view of recessing the second semiconductor region with a non-vertical etch according to further embodiments of the disclosure.

Referring now to FIGS. 4 and 5 together, the recessing of second fin(s) 110B may create a set of pedestals 172 (FIG. 4 only) or a set of tapered pedestals 174 (FIG. 5 only) on second fin(s) 110B. Each pedestal 172, 174 may be, e.g., a non-recessed portion of second fin(s) 110B beneath one corresponding gate structure 120. Pedestal(s) 172 may feature vertical sidewalls in cases where second fin(s) 110B is substantially vertically etched. To prevent residual spacer material from being formed on second fin(s) 110B in subsequent processing, non-vertical etching of second fin(s) 110B may create tapered pedestals 174. To form tapered pedestals 174, one or more directional etchants may be applied to second fin(s) 110B at a substantially non-vertical angle, thereby forming tapered sidewalls 174 beneath gate structure(s) 120. Forming tapered sidewalls 174 in some embodiments may allow subsequently-deposited spacer materials to be removed from second fin(s) 110B by a vertical directional etch, as noted elsewhere herein. The height of each pedestal 172, 174 above second fin(s) 110B in any case may be substantially equal to recess depth R. Subsequent processes according to the disclosure may be implemented substantially identically, and without regard to whether pedestal(s) 172 and/or tapered pedestal(s) 174 are formed. Pedestal(s) 172 thus may be interpreted as generically including tapered pedestal(s) 174 except where otherwise noted herein.

Figure 6:
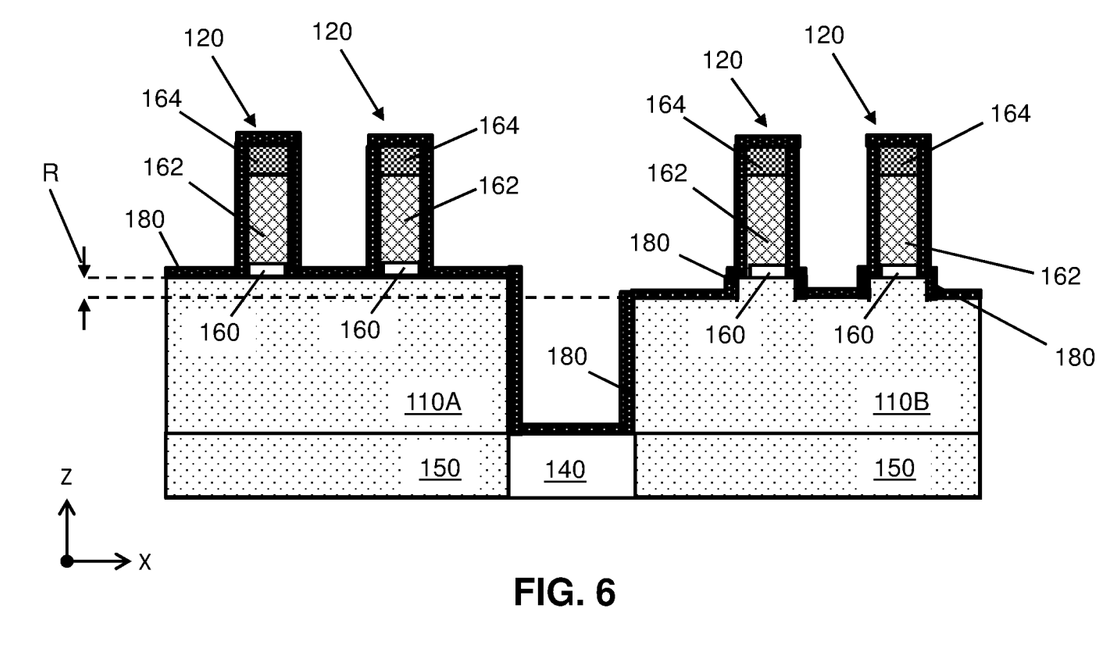
FIG. 6 shows a cross-sectional view of removing the mask and forming a spacer liner on the gate structures and semiconductor regions according to embodiments of the disclosure.

Turning to FIG. 6, spacer(s) 166 may be replaced with another spacer material in some embodiments. Before spacer(s) 166 may be replaced, mask(s) 170 may be removed from first fin 110A and gate structure(s) 120 by stripping, selective etch, and/or other techniques to suitable to remove mask 170. Spacer(s) 166 (FIGS. 1-5) as noted herein may be a placeholder insulator material, to be replaced with a different spacer material before a transistor structure is formed. Continued processing thus may include removing spacer(s) 166 and forming one or more different spacer materials in its place. Spacer(s) 166 may be removable through any currently known or later developed technique for selectively removing insulative materials. Spacer(s) 166 may be removed by stripping, i.e., a process in which insulative materials and/or previously-deposited photomasks are removed from a surface of another material. Stripping may occur, e.g., after processes such as etching or ion implantation. Stripping may involve the use of wet or dry (ashing) strongly oxidizing chemistries. Suitable etching materials may depend on the composition of spacer(s) 166, and/or the composition of materials not positioned below or adjacent to spacer(s) 166. In some embodiments, the spacer(s) 166 may be thinned, but not fully removed.

After the removing of spacer(s) 166 (FIGS. 1-5), replacement spacer materials may be formed on exposed surfaces of the remaining semiconductor and gate structures. A spacer liner 180 may be conformally deposited on first semiconductor fin 110A, second semiconductor fin 110B, and each gate structure 120 to coat exposed surfaces thereof. As will also be noted below regarding FIG. 10, spacer liner 180 may also be formed on other exposed surfaces of the structure, not shown in the X-Z plane of FIG. 6. Spacer liner 180 may include one or more insulative materials different from those included within spacer(s) 166. For instance, spacer liner 180 may include one or more insulative oxides, nitrides, and/or other electrically insulative materials described herein. Spacer liner 180 in some cases may include one or more low-k dielectric materials capable of being selectively or non-selectively deposited as a film of dielectric material. Two example materials capable of being conformally deposited as spacer liner 180 may include, e.g., silicon nitride ($Si_3N_4$) and/or silicon dioxide ($SiO_2$). In the case of a single conformal deposition, spacer liner 180 may also be conformally deposited on portions of STI 140 horizontally between each semiconductor fin 110A, 110B. In subsequent processing, various portions of spacer liner 180 may be removed, e.g., by stripping, such that remaining portions of spacer liner 180 are positioned exclusively on gate structure 120.

Figure 7:
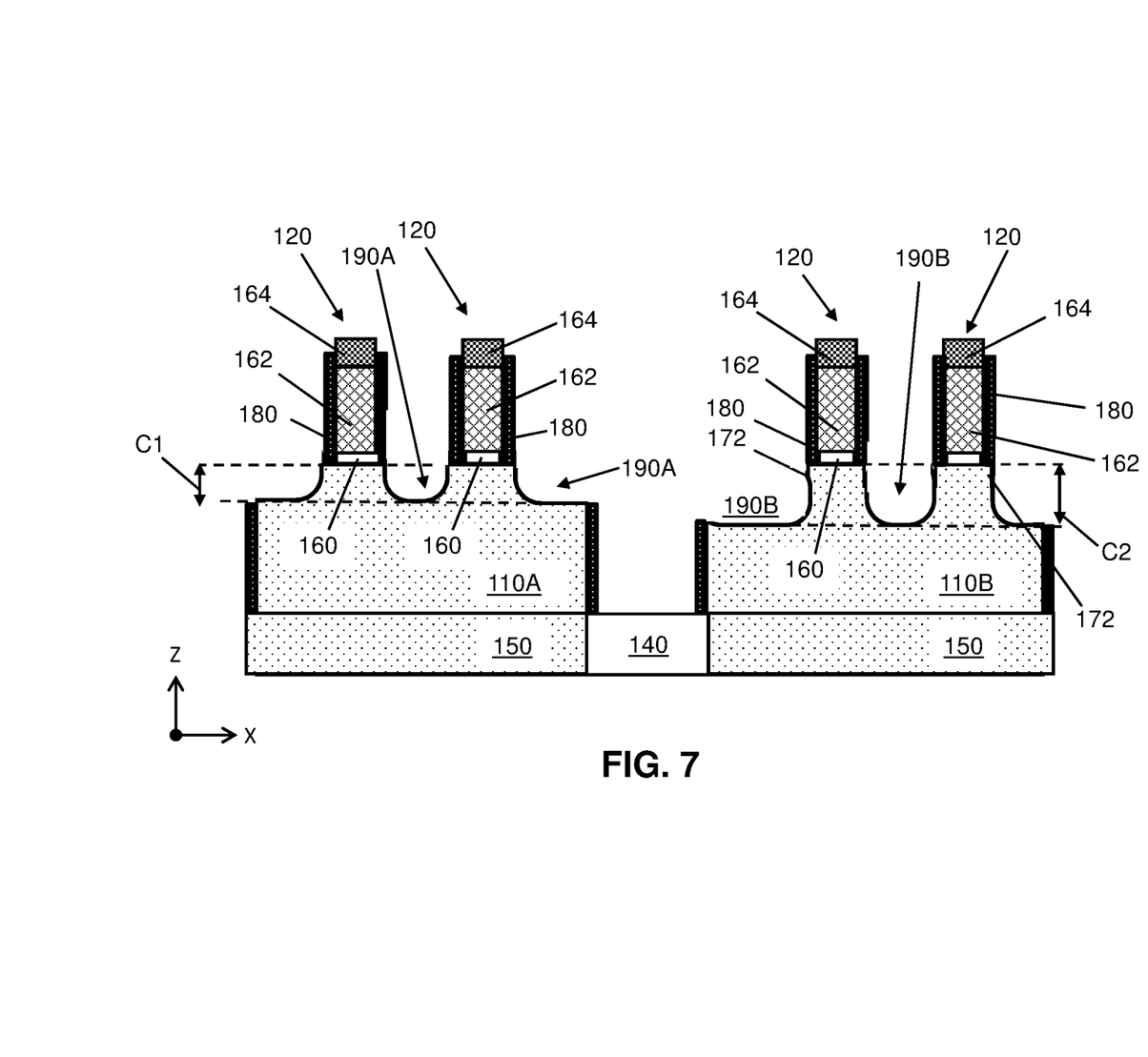
FIG. 7 shows a cross-sectional view of forming a plurality of cavities within the first and second semiconductor regions according to embodiments of the disclosure.

Referring to FIG. 7, continued processing includes forming a plurality of cavities 190 (separately identified as 190A, 190B) within fins 110A, 110B. One or more first cavities 190A are formed in fin 110A, while one or more second cavities 190B are formed in fin 110B. Cavities 190A, 190B may be formed by a single downward etching of fins 110A, 110B, but may be different in size. First cavities 190A may have a first depth C1 within fin 110A. Second cavities 190B may have a second depth C2 within fin 110B. Cavities 190 may be formed with a single etching of fins 110A, 110B, e.g., by a downward etch. In this case, one or more particularly aggressive etching materials (e.g., those having a higher etch rate than conventional etchants when applied to silicon) may be used. Even when a single etchant or instance of etching is used, second depth C2 within second fin 110B may be substantially greater than that of first depth C1. The difference in depths is due to the prior recessing of second fin 110B to form pedestal(s) 172, 174 with mask 170 (FIGS. 3-5) in place. The size difference between cavities 190A and cavities 190B may allow epitaxial regions of different size to be formed therein.

The forming of cavities 190A, 190B is a preliminary step to epitaxially growing source and drain materials on fin(s) 110A, 110B to provide functional elements of a transistor structure. Cavities 190A, 190B thus may extend only partially into each fin 110A, 110B from upper surfaces thereof. The use of a downward etch will move downward through the tapered sidewalls of any previously-formed tapered pedestal(s) 174 (FIG. 5). Thus, cavities 190A, 190B may have a similar, but slightly more rounded bottom shape, as compared to cases where pedestals 172 without tapered sidewalls are formed. The prior forming of tapered pedestals 174, however, may be particularly to remove portions of spacer liner 180 below gate structure(s) 120, e.g., by providing a non-vertical surface from which spacer liner 180 may be removed. Portions of spacer liner 180 positioned alongside the sidewalls of each fin 110A, 110 B may remain intact, as shown. Cavities 190A, 190B may be formed by a single downward directional etch of spacer liner(s) 180 and fin(s) 110A, 110B, e.g., by RIE or other etching processes capable of removing semiconductor material without significantly etching non-semiconductor device components. Other portions of spacer liner 180 may remain intact alongside vertical sidewalls of gate structure 120.

Figure 8:
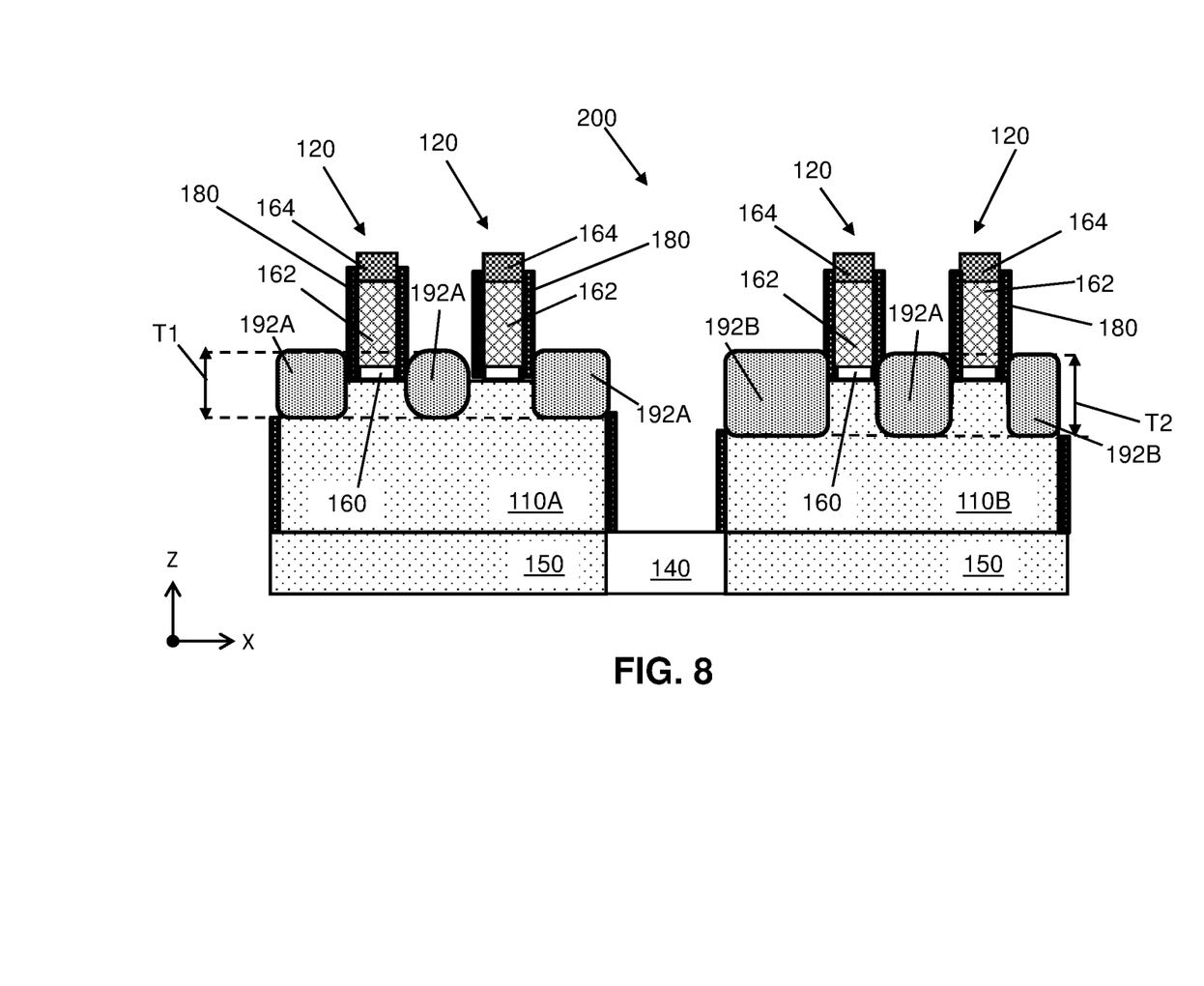
FIG. 8 shows a cross-sectional view of growing epitaxial regions within the plurality of cavities according to embodiments of the disclosure.

Referring to FIG. 8, embodiments of the disclosure include forming epitaxial regions 192A, 192B within cavities 190A, 190B (FIG. 7). Epitaxially grown material within first cavity 190A constitutes a first epitaxial region 192A, and epitaxially grown material within second cavity 190B constitutes a second epitaxial region 192B. Epitaxial regions 192A, 192B on opposite sides of each gate structure 120 may provide source and drain terminals of a transistor formed from fin(s) 110A, 110B. Epitaxial regions 192A, 192B may be formed within fin(s) 110A, 110B, e.g., by epitaxially growing semiconductor material within cavities 190A, 190B. Epitaxial regions 192A, 192B may have a different material composition from the remainder of each respective fin 110A, 110B. Gate structure 120 and remaining portions of spacer liner 180 may shield a portion of fin(s) 110A, 110B as epitaxial regions 192A, 192B are being formed. Epitaxial regions 192A, 192B may include one or more semiconductor materials of fin 110A, 110B, or a different semiconductor material, but with dopants therein. Implanting dopants into epitaxial regions 192A, 192B may provide greater conductivity than other portions of fin(s)

110A, 110B. These properties may allow epitaxial regions 192A, 192B to form the eventual source and drain regions of a transistor. In some cases, epitaxial regions 192A, 192B may be implanted with a strain-inducing material, such as germanium or carbon. The dopants used to form epitaxial regions 192A, 192B may be introduced in situ or an implantation process may be performed to affect only epitaxial regions 192A, 192B. According to an example, fin(s) 110A, 110B are not previously doped before epitaxial regions 192A, 192B are formed. In some cases, an additional mask (not shown) may be formed over a single epitaxial region 192A, 192B while the other epitaxial region is doped, e.g., to give each epitaxial region 192A, 192B a different doping profile, and/or dopant material, with respect to the other. Due to the difference in size between first cavities 190A, 190B, epitaxial regions 192A, 192B may have different thicknesses within fin(s) 110A, 110B. As shown, first epitaxial region 192A may have a first thickness T1 that is less than a second thickness T2 of second epitaxial region 192B. The different thicknesses T1, T2, may stem from the earlier recessing of second fin 110B with mask 170 (FIGS. 3-5) in place.

Figure 9:
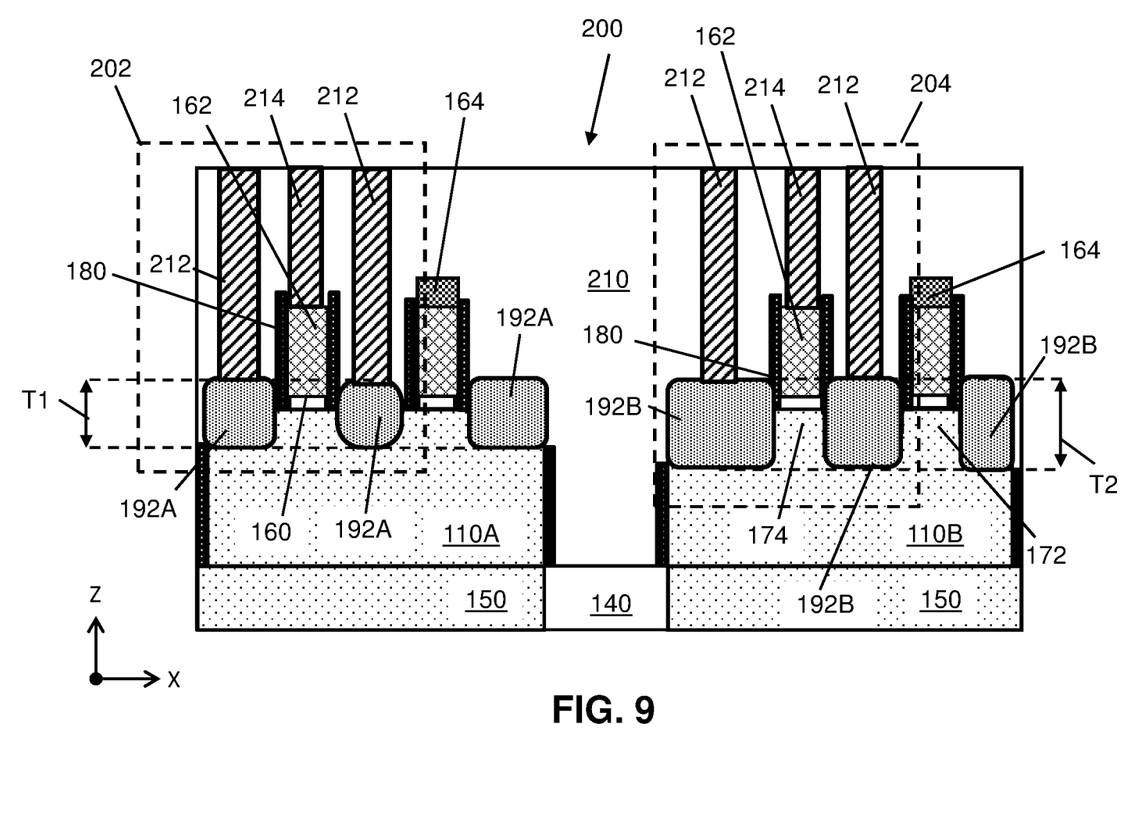
FIG. 9 shows a cross-sectional view of an IC structure according to embodiments of the disclosure.

FIG. 9 illustrates an IC structure 200 according to embodiments of the disclosure. IC structure 200 may include a first transistor 202 and a second transistor 204 with differently-sized epitaxial regions 192A, 192B, respectively. As discussed elsewhere, epitaxial region 192B within second transistor 204 may be larger in size than epitaxial region 192A of first transistor 202. IC structure 200 may include semiconductor fin(s) 110A, 110B on substrate 150, and the transversely-extending gate structure(s) 120 with spacer liner(s) 180 thereon. Further processing of structure 200 may include forming connections to overlying portions of a device, e.g., various metal wiring levels for interconnecting devices, components, etc., formed on substrate 150. An inter-level dielectric (ILD) 210 may be formed above fin(s) 110A, 110B, gate structures 120, ILD 140, and other previously-formed materials, e.g., by deposition or other techniques of forming an insulative material on a structure. ILD 210 may include one or more of the same insulating material as STI(s) 140, spacer liner(s) 180, or may include a different electrically insulative material.

Contacts to overlying circuit elements may be formed using an additional mask (not shown) on predetermined portions of ILD 210 while leaving other materials uncovered. A controlled amount of vertical etching with the mask in place may form openings to one or more contact sites. The openings then may be filled with a conductor. Such contacts may include, e.g., a set of first contacts 212 extending from the top of ILD 210 to epitaxial regions 192A, 192B adjacent gate structure(s) 120. A set of second contacts 214 may extend from the top of ILD 210 to gate structure(s) 120. As shown, gate cap 164 may be removed from selected gate structures 120 before second contacts 214 are formed, thereby allowing second contacts 214 to be formed directly on gate region 162. Each contact 212, 214 may include any currently known or later developed conductive material configured for use in an electrical contact, e.g., copper (Cu), aluminum (Al), tungsten (W), cobalt (Co), titanium (Ti), etc. First and second contacts 212, 214 may additionally include refractory metal liners (not shown) positioned alongside ILD 210 to prevent electromigration degradation, shorting to other components, etc. As shown, structure 200 includes first transistor 202, 204 in the form of two FinFET transistors, though it is understood that embodiments of structure 200 may include other transistor architectures (e.g., planar FETs), e.g., by recessing two regions of a non-fin semiconductor region through one or more of the processes described elsewhere herein.

Figure 10:
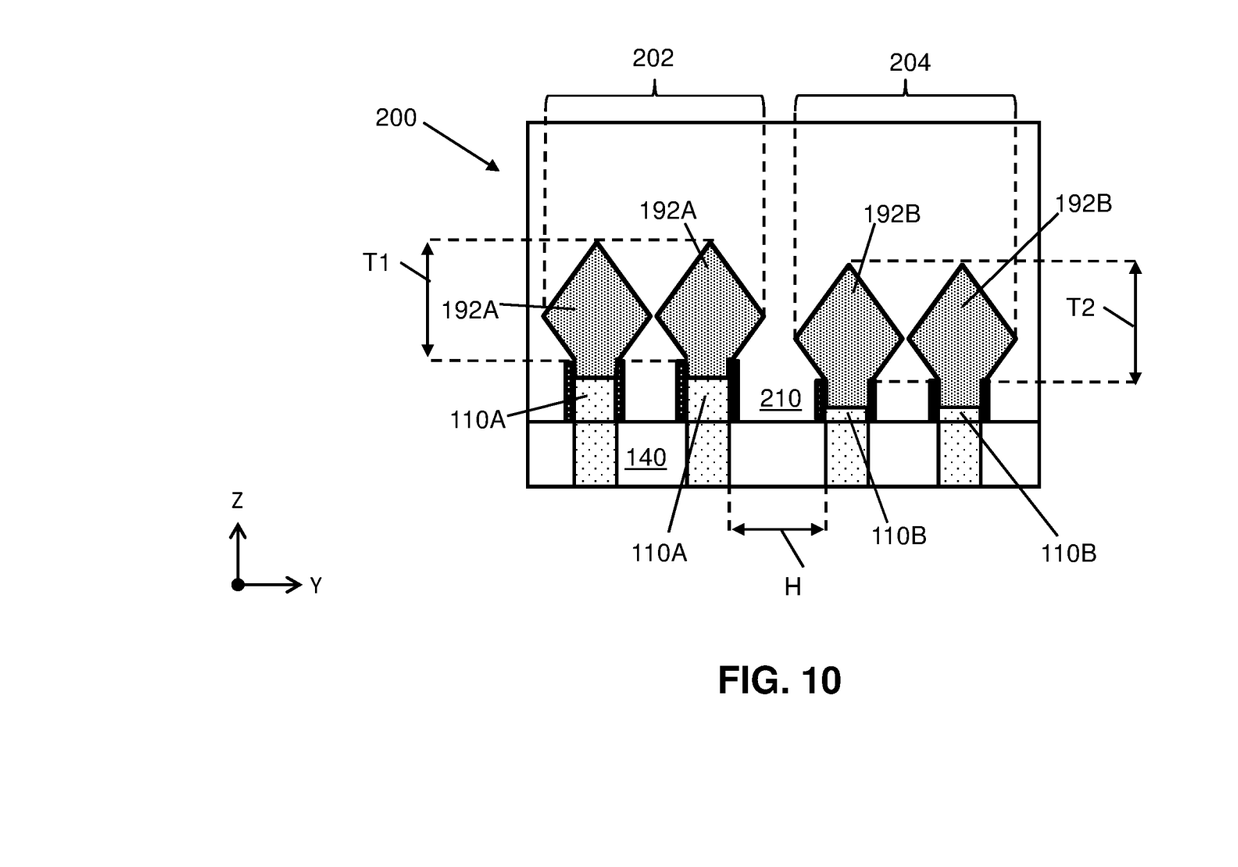
FIG. 10 shows a different cross-sectional view of the IC structure with differently-sized epitaxial regions according to embodiments of the disclosure.

Referring to FIG. 10, a cross-sectional view of structure 200 in plane Y-Z is shown according to further embodiments. In the example of FIG. 10, a set of first transistors 202 is shown adjacent to a set of second transistors 204 in plane Y-Z for the sake of example. Additionally, FIG. 10 depicts an embodiments where fins 110A, 110B are recessed above the upper surface of STI 140. It is understood that the various features of FIG. 10 may also appear in sets of transistors 202, 204 horizontally aligned in the X-Z plane as shown in FIG. 9. Contacts 212, 214 (FIG. 9) are omitted from FIG. 10 solely to better illustrate various details of epitaxial region(s) 192A, 192B. In the case of a FinFET transistor, the growing of epitaxial region(s) 192A, may cause semiconductor material to grow horizontally in plane Y-Z in addition to growing vertically upward. Epitaxial region(s) 192A, 192B are shown to have a diamond shape in FIG. 10, but a variety of geometries (including, e.g., amorphous epitaxial regions) are possible in various implementations. In addition, remaining portions of spacer liner 180 may remain intact on sidewalls of each fin 110A, 110B.

The differently-sized cavities 190A, 190B (FIG. 7) may cause epitaxially grown material on second fin(s) 110B to be larger than the same material grown on first fin(s) 110A. As noted elsewhere herein, the prior recessing of second fin(s) 110B may cause epitaxial regions 192A to have a first thickness T1 greater than a second thickness T2 of epitaxial regions 192B. The difference between first and second thicknesses T1, T2, may be up to approximately ten nm as noted elsewhere herein. Second epitaxial region(s) 192B having greater thickness than first epitaxial region(s) 192A may allow a circuit fabricator to induce more strain into second fin(s) 110B during manufacturing. Epitaxial regions 192A, 192B each may include a strain-inducing semiconductor material that is different from the semiconductor material(s) included within fin(s) 110A, 110B. Where fin(s) 110A, 110B include silicon, for example, epitaxial region(s)) 192A, 192B may include silicon germanium (SiGe). Pursuant to strain engineering, growing a larger amount of strain-inducing semiconductor material will increase the operational speed of transistors formed from the strain-inducing material. For this reason, second fin(s) 110B may be particularly suitable to form logic transistors in an IC structure, whereas first fin(s) 110A with a lower amount of strain-inducing material may be suitable to form memory components, e.g., random access memory as discussed below.

The sizing of each transistor 202, 204 may also provide various advantages and operational characteristics. A horizontal spacing H between adjacent first and second transistors 202, 204 may be, e.g., approximately thirty nm to prevent merger between epitaxial regions 192A, 192B. In other cases, horizontal spacing H may be selected for compliance with varying design rules. A further advantage of structure 200 in embodiments of the disclosure is the vertical displacement between epitaxial regions 192A, 192B shown in FIGS. 9 and 10, due to first fin(s) 110A being taller than second fin(s) 110B beneath epitaxial regions 192A, 192B. The vertical displacement between epitaxial regions 192A, 192B reduces the chance that epitaxial regions 192A, 192B will merge into each other and become a continuous semiconductor material, e.g., due to the presence of both horizontal and vertical distance between the two transistors 202, 204.

These physical differences between first and second transistors 202, 204 may be particularly advantageous where first and second transistors 202, 204 perform different functions. In an example, first transistor(s) 202 may include a static random access memory (SRAM) transistor for storing and retrieving data. In the same example, second transistor(s) 204 may include a logic transistor for executing various software processes of a device, e.g., comparing, calculating, determining, etc. SRAM transistors may require less physical space to store and retrieve data than other transistor types. In particular, logic transistors may require larger-size source and drain regions than SRAM transistors to provide higher operating speeds. Although SRAM and logic transistors are discussed for the sake of example, it is understood that first and second transistors 202, 204 may be any desired combination of transistor architectures designed to have different dimensions, shapes, etc.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
    forming a mask over a substrate to cover a first semiconductor region on the substrate and a first gate structure on the first semiconductor region, without covering a second semiconductor region on the substrate and a second gate structure on the second semiconductor region, the first semiconductor region horizontally separated from the second semiconductor region;
    recessing the second semiconductor region from an initial height above the substrate to a reduced height above the substrate, wherein recessing the second semiconductor region includes non-vertically etching the second semiconductor region to form a tapered recess within the second semiconductor region, wherein the difference between the initial height above the substrate and the reduced height above the substrate is up to approximately ten nanometers (nm);
    removing the mask;
    forming a plurality of cavities by etching the first and second semiconductor regions after removing the mask, the plurality of cavities including a first cavity having a first depth within the first semiconductor region and a second cavity having a second depth within the second semiconductor region, wherein the second depth is greater than the first depth; and
    forming a plurality of epitaxial regions within the plurality of cavities, wherein the plurality of epitaxial regions includes a first source/drain region within the first semiconductor region adjacent the first gate structure, and a second source/drain region within the second semiconductor region adjacent the second gate structure.

2. The method of claim 1, wherein forming the plurality of epitaxial regions within the plurality of cavities includes performing a single epitaxial growth, and wherein a horizontal width of the first source/drain region is greater than a horizontal width of the second source/drain region after the single epitaxial growth.

3. The method of claim 1, further comprising:
    forming a static random access memory (SRAM) transistor from the first source/drain region and the first gate structure; and
    forming a logic transistor from the second source/drain region and the second gate structure, wherein the logic transistor is electrically isolated from the SRAM transistor.

4. The method of claim 1, further comprising implanting a dopant into the first semiconductor region before removing the mask.

5. The method of claim 1, wherein forming the plurality of cavities includes performing a single etching of the first and second semiconductor regions.

6. A method of forming an integrated circuit (IC) structure, the method comprising:

forming a mask over a substrate to cover a first semiconductor fin on the substrate and a first gate structure on the first semiconductor fin, without covering a second semiconductor fin on the substrate and a second gate structure positioned on a first portion of the second semiconductor fin, the first semiconductor fin horizontally separated from the second semiconductor fin by a shallow trench isolation (STI);

recessing a second portion of the second semiconductor fin from an initial height above the substrate to a reduced height above the substrate, such that a bottom surface of the first gate structure and a bottom surface the second gate structure are horizontally aligned after recessing the second portion;

removing the mask;

forming a plurality of cavities by etching the first and second semiconductor fins after removing the mask, the plurality of cavities including a first cavity having a first depth within the first semiconductor fin and a second cavity having a second depth within the second semiconductor fin, wherein the second depth is greater than the first depth; and forming a plurality of epitaxial regions within the plurality of cavities, wherein the plurality of epitaxial regions includes a first source/drain region within the first semiconductor fin adjacent the first gate structure, and a second source/drain region within the second semiconductor fin adjacent the second gate structure, wherein each of the plurality of epitaxial regions includes a strain-inducing material having a different material composition from the first and second semiconductor fins.

7. The method of claim 6, further comprising:
forming a static random access memory (SRAM) transistor from the first source/drain region and the first gate structure; and
forming a logic transistor from the second source/drain region and the second gate structure, wherein the logic transistor is electrically isolated from the SRAM transistor.

8. The method of claim 6, further comprising implanting a dopant into the first semiconductor fin before removing the mask, wherein the mask prevents migration of the dopant into the second semiconductor fin during the implanting.

9. The method of claim 6, wherein forming the plurality of cavities includes performing a single etching of the first and second semiconductor fins.

10. The method of claim 6, wherein recessing the second semiconductor fin includes non-vertically etching the second portion of the second semiconductor fin to form tapered sidewalls on an upper surface of the second semiconductor fin.

11. The method of claim 6, further comprising forming a spacer liner on the first semiconductor fin, the second semiconductor fin, the first gate structure, and the second gate structure after removing the mask.

12. The method of claim 6, wherein the recessing includes recessing the second portion of the second semiconductor region by up to approximately ten nanometers (nm).

13. An integrated circuit (IC) structure, comprising:
a first semiconductor region over a substrate;
a first transistor on the first semiconductor region, the first transistor including a first source region and a first drain region each having a first thickness within the semiconductor region;
a second semiconductor region over the substrate, wherein a shallow trench isolation (STI) horizontally separates the second semiconductor region from the first semiconductor region; and
a second transistor on the second semiconductor region, the second transistor including a channel region within a semiconductor pedestal having tapered sidewalls, a second source region adjacent a first horizontal end of the semiconductor pedestal, and a second drain region adjacent a second horizontal end of the semiconductor pedestal, the source region and drain region each having a second thickness within the semiconductor region, wherein the first thickness is up to approximately ten nanometers (nm) larger than the second thickness.

14. The IC structure of claim 13, wherein the first transistor includes a static random access memory (SRAM) transistor, and the second transistor includes a logic transistor, wherein the logic transistor is electrically isolated from the SRAM transistor.

15. The IC structure of claim 13, wherein the first semiconductor region includes a first fin having a first height above the substrate, the second semiconductor region includes a second fin having a second height above the substrate, and wherein the second height above the substrate is less than the first height above the substrate.

16. The IC structure of claim 13, wherein a dopant profile of the first source region and the first drain region is different from a dopant profile of the second source region and the second drain region.

17. The IC structure of claim 13, wherein the first source region, the first drain region, the second source region, and the second drain region each include a strain-inducing material, and wherein the first and second semiconductor regions do not include the strain-inducing material.

18. The method of claim 1, wherein the second gate structure is positioned on a non-recessed portion of the second semiconductor region at the initial height above the substrate, wherein a bottom surface the second gate structure is horizontally aligned with a bottom surface of the first gate structure.

19. The method of claim 1, wherein forming the mask over the substrate includes depositing an organic planarization layer (OPL) material.

* * * * *